United States Patent
Khoini-Poorfard et al.

(10) Patent No.: US 8,848,110 B2
(45) Date of Patent: Sep. 30, 2014

(54) MIXED-MODE RECEIVER CIRCUIT INCLUDING DIGITAL GAIN CONTROL

(75) Inventors: Ramin Khoini-Poorfard, Austin, TX (US); Alan F. Hendrickson, Rollingwood, TX (US); Alessandro Piovaccari, Austin, TX (US); David S. Trager, San Marcos, TX (US); Aslamali A. Rafi, Austin, TX (US); Abdulkerim L. Coban, Austin, TX (US); David Le Goff, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 759 days.

(21) Appl. No.: 12/790,405

(22) Filed: May 28, 2010

(65) Prior Publication Data

US 2011/0235758 A1    Sep. 29, 2011

Related U.S. Application Data

(60) Provisional application No. 61/318,775, filed on Mar. 29, 2010.

(51) Int. Cl.
| | |
|---|---|
| H04N 5/52 | (2006.01) |
| H04N 5/44 | (2011.01) |
| H04L 27/02 | (2006.01) |
| H03G 3/30 | (2006.01) |
| H04N 5/455 | (2006.01) |
| H03G 3/00 | (2006.01) |
| H04L 27/00 | (2006.01) |
| H04L 27/08 | (2006.01) |
| H04N 5/04 | (2006.01) |

(52) U.S. Cl.
CPC ............... *H04N 5/455* (2013.01); *H04L 27/02* (2013.01); *H04N 5/52* (2013.01); *H03G 3/3068* (2013.01); *H03G 3/002* (2013.01); *H03G 3/001* (2013.01); *H04N 5/04* (2013.01); *H04L 27/0002* (2013.01); *H04L 27/08* (2013.01)
USPC ..................... 348/678; 348/725; 348/682

(58) Field of Classification Search
USPC ............... 348/678–679, 725, 726, 731, 735, 348/682–685, 500, 521, 524, 533–536, 540, 348/545, 554–555; 375/326, 345
IPC .............................................. H04N 5/52,5/44
See application file for complete search history.

(56) References Cited

U.S. PATENT DOCUMENTS

| | | | |
|---|---|---|---|
| 5,307,512 A | 4/1994 | Mitzlaff | |
| 5,737,035 A | 4/1998 | Rotzoll | |

(Continued)

FOREIGN PATENT DOCUMENTS

| | | |
|---|---|---|
| EP | 0814569 A1 | 12/1997 |
| GB | 2332313 A | 6/1999 |

*Primary Examiner* — Trang U Tran

(74) *Attorney, Agent, or Firm* — Cesari & Reed LLP; R. Michael Reed

(57) ABSTRACT

A receiver circuit includes an analog front-end and a digital processing unit. The analog front-end includes an input for receiving a radio frequency (RF) signal, a first control input for receiving a gain adjustment signal, a second control input for receiving a timing signal, and a signal output for providing a digital intermediate frequency (IF) signal. The analog front-end updates gains of a plurality of gain stages according to the gain adjustment signal and in synchronism with the timing signal. The digital processing unit is configured to produce at least one output signal derived from the digital IF signal. The digital processing unit includes a timing recovery circuit configured to generate the timing signal based on the digital IF signal to control timing of the updating gains of each of the plurality of adjustable gain stages.

18 Claims, 3 Drawing Sheets

(56) References Cited

U.S. PATENT DOCUMENTS

| | | | |
|---|---|---|---|
| 5,838,390 A * | 11/1998 | Hankinson et al. | 348/682 |
| 5,909,645 A | 6/1999 | Abramsky et al. | |
| 5,956,098 A * | 9/1999 | Mizukami et al. | 348/735 |
| 6,088,583 A | 7/2000 | Shimizu et al. | |
| 6,167,244 A | 12/2000 | Tomoe | |
| 6,177,964 B1 * | 1/2001 | Birleson et al. | 348/725 |
| 6,208,849 B1 | 3/2001 | Cho et al. | |
| 6,272,323 B1 | 8/2001 | Kurihara | |
| 6,377,315 B1 | 4/2002 | Carr et al. | |
| 6,549,096 B2 | 4/2003 | Groves et al. | |
| 6,678,011 B2 * | 1/2004 | Yanagi et al. | 348/725 |
| 6,748,201 B2 | 6/2004 | Black et al. | |
| 6,759,902 B2 | 7/2004 | Kossor | |
| 6,778,117 B1 | 8/2004 | Johnson | |
| 6,985,192 B1 * | 1/2006 | Bouillet et al. | 348/735 |
| 7,305,223 B2 | 12/2007 | Liu et al. | |
| 7,362,178 B2 | 4/2008 | Montemayor et al. | |
| 2003/0181178 A1 | 9/2003 | Zerod et al. | |
| 2003/0207675 A1 | 11/2003 | Hughes et al. | |
| 2004/0004673 A1 * | 1/2004 | Jeong et al. | 348/678 |
| 2006/0222115 A1 | 10/2006 | Dornbusch et al. | |
| 2007/0042736 A1 | 2/2007 | Tateno et al. | |
| 2010/0130153 A1 | 5/2010 | Khoini-Poorfard et al. | |
| 2010/0130155 A1 | 5/2010 | Khoini-Poorfard et al. | |
| 2010/0130158 A1 | 5/2010 | Khoini-Poorfard et al. | |

* cited by examiner

MIXED-MODE RECEIVER CIRCUIT INCLUDING DIGITAL GAIN CONTROL

CROSS-REFERENCE TO RELATED APPLICATION(S)

This application is a non-provisional of and claim priority from U.S. Provisional Patent Application No. 61/318,775 filed on Mar. 29, 2010 entitled "Mixed-Mode Receiver Circuit Including Digital Gain Control," which is incorporated herein by reference in its entirety.

FIELD

The present disclosure is generally related to receiver circuits that include digital gain control, and more particularly to mixed-mode receiver circuits including digital gain control.

BACKGROUND

A radio frequency (RF) signal includes useful information that is modulated onto a carrier signal. An RF receiver is a circuit configurable to retrieve the useful information from the RF signal. RF receivers are used in a wide range of applications, including television (TV) receivers (including cable and satellite set-top boxes), cellular telephones, pagers, global positioning systems, cable modems, cordless telephones, satellite radios, and other electronic devices. As used herein, the term "RF signal" refers to an electromagnetic signal having a frequency in a spectrum from about 3 kilohertz (kHz) to hundreds of gigahertz (GHz), regardless of the transmission medium through which such a signal is conveyed. Thus, an RF signal may be transmitted through air, free space, coaxial cabling, twisted pair cabling, fiber optic cabling, etc.

In many broadcast RF transmission systems, the frequency spectrum is relatively wide and is divided into separate channels (or frequency bands) that include different information. For example, a TV signal can be composed of one or multiple carriers, which can be analog modulated (ATV), or digitally-modulated (DTV), and which generally occupy a bandwidth of 6, 7 or 8 megahertz (MHZ). A TV receiver can receive such a wide spectrum RF signal, mix a desired channel within the RF signal to a convenient intermediate frequency (IF) to produce an IF signal that is easier to filter, and then convert the IF signal to a baseband signal for further processing. For example, a TV receiver may translate a selected channel having a bandwidth of approximately 6-8 MHz and a center frequency within a frequency range of approximately 48 MHz to 870 MHz to an intermediate center frequency of 44 MHz, filter the 44 MHz IF signal, and then convert the 44 MHz IF signal to a baseband frequency for further processing, such as by a digital signal processor.

Often, the power level of the RF signal in a particular channel is low, and the RF receiver amplifies the RF signal before and after mixing or otherwise processing the RF signal, which is either limited in noise or linearity performance. Thus, receivers, such as TV receivers, commonly use a technique known as automatic gain control (AGC) to amplify the RF signal to an appropriate power level.

High quality television receivers have traditionally included AGC circuitry that adjusts the gain or attenuation of various elements in the receiver, regulating power levels within the receiver circuitry. For example, a television signal with low input power can be amplified to increase the signal strength for further processing. In another example, a filtered signal may be too powerful for another component in the signal path, and so the filtered signal can be attenuated to decrease the power level. Without such AGC circuitry, the displayed image of an analog television signal would become dimmer when the power level decreases and brighter as the power level increases.

In receivers with AGC circuitry, sudden changes in the input power level can cause undesirable operation, causing the displayed image to appear to flicker and the sound track to include noticeable changes in volume or even lose video or audio reception for brief periods. The levels of the signals can change suddenly when, for example, a moving receiver passes into a tunnel or behind a building, or an obstruction, such as an airplane, passes between the transmitter and the receiver.

To efficiently implement AGC in highly integrated receivers, the gain or attenuation of the various elements can be controlled discretely in small gain steps. However, to achieve the desired gain through such small gain steps, a large number of small gain or attenuation elements are switched on or off in order to achieve the desired gain. Such small gain or attenuation elements are easily created in an integrated circuit process technology, such as a complementary metal-oxide semiconductor (CMOS) process. However, the large number of gain or attenuation elements leads to larger die sizes and higher production costs. Moreover, for a given technology there may be a physical limit to what level of resolution is achievable, and requirements for good reception of video signals approach that limit.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

An embodiment of a mixed signal TV receiver circuit is described below that includes a means of performing automatic gain control (AGC) to adjust a received signal, such as a TV signal, where the size and timing of the gain steps are controlled to avoid undesired artifacts in a visible portion of the output signal. The receiver circuit includes an analog front-end, a digital processing unit, and may also include a data processor. The analog front-end may be implemented using CMOS devices with gain control that is discrete in both time and amplitude.

The receiver circuit allows for discrete gain control in the analog domain, thereby allowing improved noise and distortion performance and lower power consumption in the sensitive radio frequency (RF) and intermediate frequency (IF) analog portions of a CMOS mixed-signal TV receiver circuit. Further, the CMOS mixed-signal implementation offers an improvement in terms of cost and provides application flexibility, including providing programmability to configure the receiver circuit to operate within any analog or digital TV standard.

Figure 1:
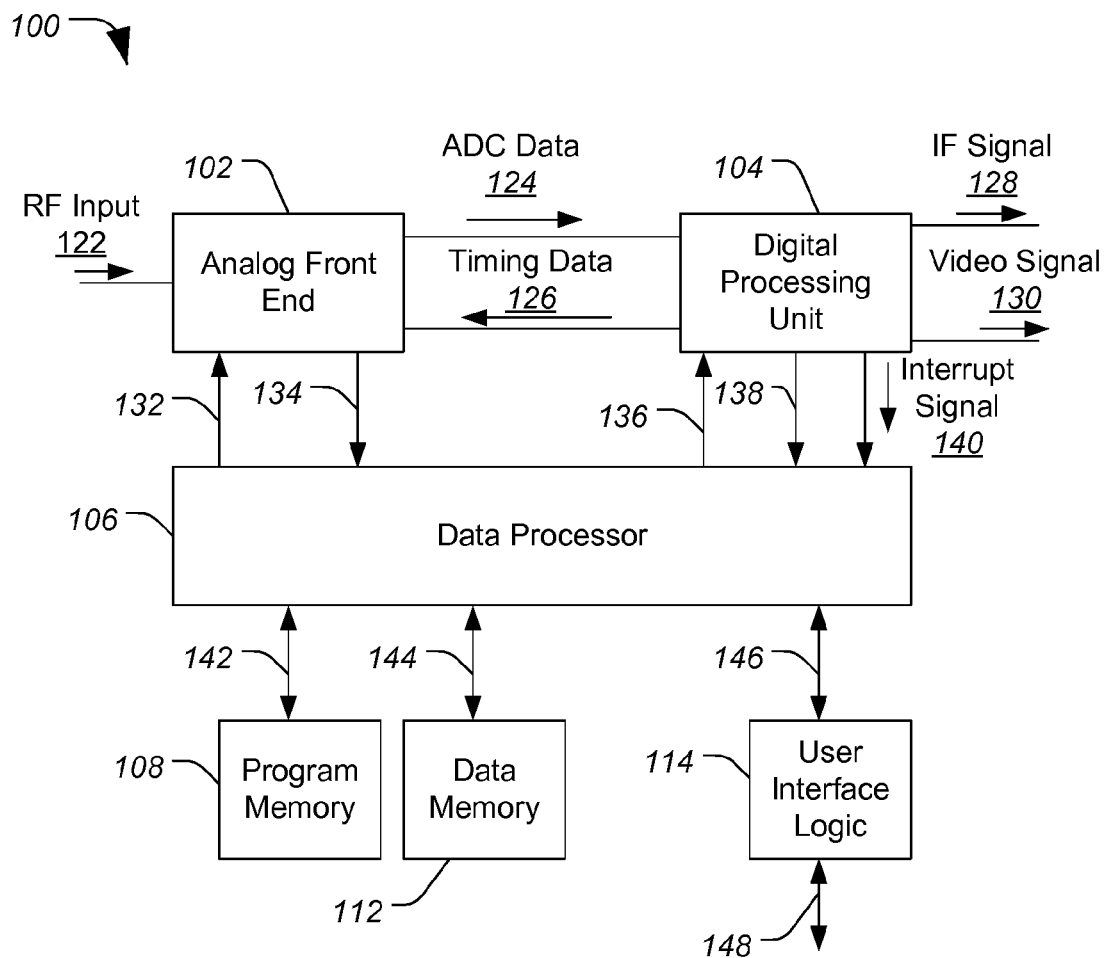
FIG. 1 is a block diagram of an embodiment of a receiver circuit including an analog front-end, a data processing unit, and circuitry for providing signal power level sensing and digitally adjustable gain control.

FIG. 1 is a block diagram of an embodiment of a receiver circuit 100 including an analog front-end 102, a digital processing unit 104, and circuitry for providing a digitally adjustable gain control. Receiver circuit 100 further includes a data processor 106 connected to analog front-end 102 and to digital processing unit 104. Receiver circuit 100 further includes program memory 108 connected to data processor 106 and configured to store instructions executable by data processor 106. Further, receiver circuit 100 includes data memory 112 connected to data processor 106 and configured to store data, such as configuration data for the various circuit components. Some of the instructions in program memory 108 may be executed by data processor 106 in conjunction with user interface logic 114, which may be accessed by a user to configure receiver circuit 100. In another embodiment, data processor 106 can be implemented with a hardware state machine and program memory 108 and data memory 112 can be omitted.

Receiver circuit 100 is capable of both RF-AGC and delayed-AGC methods to achieve the desired performance. A distinction can be made among AGC methods for TV receivers between RF-AGC methods and delayed-AGC methods. RF-AGC methods use level detectors at the RF input to improve the signal-to-noise ratio (SNR) while detecting and preventing overload of the input circuitry and associated distortion of the RF input signal. In this way, the RF portion of the receiver 100 and the AGC function operate somewhat independently from the IF portion. Delayed-AGC methods do not use such RF level detectors. Instead, delayed-AGC methods measure signal levels after some amount of signal processing, typically after frequency translation to an intermediate frequency (IF) and channelization. Delayed-AGC methods offer lower cost solutions; however, because of distributed filtering through the receiver chain, delayed-AGC methods may result in undetectable overloading at the RF input due to presence of interferers, which are not represented at the point in the circuit where the level detection is performed. Delayed-AGC methods also result in reduced noise in level detection as compared to RF-AGC methods because of isolation of the detected signal due to channelization.

Analog front-end 102 includes an input configurable to receive an input signal, such as an analog RF signal 122. As used herein, the term "RF signal" refers to an electromagnetic signal having a frequency in a spectrum from about 3 kilohertz (kHz) to hundreds of gigahertz (GHz), regardless of the transmission medium through which such a signal is conveyed. Thus, an RF signal may be transmitted through air, free space, coaxial cabling, twisted pair cabling, fiber optic cabling, etc. Analog RF signal 122 can arrive through any of the above-identified transmission media and from any of several RF sources, such as terrestrial broadcast transmission or cable broadcast transmission. Analog RF input signal 122 includes a desired channel, i.e. a TV transmission, the content of which is desirable to demodulate, and any number of undesirable interferers or blockers, such as transmissions related to other TV broadcasts, AM, FM or CB radio, cellular telephone, military applications, emergency services, etc. In broadcast TV applications, input signal 122 is typically a very low-level signal, such as between −110 dBm and +10 dBm and with a desired channel centered at a frequency between 50 and 1000 MHz. However, analog input signal 122 may be centered at other frequencies and may include other signal levels, depending on the signal source. Moreover, even if the input analog RF signal 122 is analog in nature, it can carry either analog (ATV) or digital (DTV) information.

Analog front-end 102 processes analog input signal 122 to channelize (i.e. perform bandpass filtering) it, to translate the selected channel in frequency from the RF center frequency to the desired IF center frequency, and to digitize the IF signal to produce a digitized signal (labeled "ADC Data") 124, which is provided to digital processing unit 104. ADC Data 124 can be construed to include the contents of one of more physical ADCs, with predetermined bit-width(s) and sample-rate(s). In an embodiment, the ADC within analog front-end 102 includes dual ADCs and ADC Data 124 includes both complex in-phase (I) and quadrature (Q) data streams.

To achieve goals of amplitude regulation, signal-to-noise plus distortion ratio (SNDR), power consumption and cost, analog front-end 102 acts upon the desired channel within the RF input signal 122 to adjust (in some instances optimize) the representation of the desired channel within the dynamic range of ADC signal 124. Thus, analog front-end 102 performs frequency translation using down-converter 206 to translate the frequency of RF signal 122 to an internal IF appropriate for sampling at the ADC 216. Further, analog front-end 102 performs amplitude regulation to scale the result of frequency-translated signal appropriately with respect to the input voltage range of the ADC to reduce distortion effects inherent in analog circuits while trying to improve the SNR of the received signal. Additionally, analog front-end 102 performs channelization to prevent aliasing of image-channel and harmonically-related blockers into the desired channel and to reduce the dynamic range requirements of sub-circuits throughout the analog front-end 102.

Analog front-end 102 is connected to data processor 106 via a control bus 132, which carries a collection of digital control signals issued by data processor 106 to configure parameters of analog front-end 102, including controls determining a local oscillator (LO) frequency for down-mixing, gain control signals for amplitude scaling, and a filtering parameters for channelization.

Further, analog front-end 102 is connected to data processor 106 via status bus 134, which carries a collection of digital status signals used by algorithms implemented in the data processor 106 to control gain and synchronization characteristics of a plurality of gains stages within analog-front-end 102 via control bus 132 and to control various gain amplifiers within digital processing unit 104 via gain and other control signals applied to a control bus 136. Status bus 134 may include, for example, information about the signal level and statistics at various electrical nodes within the analog front-end 102, including nodes at the outputs of each of the gain stages.

Digital processing unit 104 processes the ADC Data 124 to regulate the amplitude of ADC Data 124 and to provide an IF output signal labeled "IF Output Signal" 128 and a video output signal labeled "Video Signal" 130. IF Output Signal 128 is one system output that can be characterized as a digital signal of predetermined bit-width and sample rate at an IF with a regulated amplitude. Video Signal 130 is a second system output that can be characterized as a digital baseband video signal, with a predetermined bit-width and sample rate, which occupies the frequency range from DC to approximately 5.5 MHz, for one particular standard. Digital processing unit 104 regulates the amplitudes of IF Output Signal 128 and Video Signal 130 relative to ADC Data 124. In an embodiment, analog front-end 102 and digital processing unit 104 cooperate to process input signal 51 to channelize, to demodulate, to digitize, to regulate the resulting signal's amplitude, and to present Video Signal 130 in such a way as to optimize the SNR of Video Signal 130. In an embodiment of the invention, the IF Output Signal 128 and the Video Signal 130 are coupled to one or more digital-to-analog converters (DACs) and buffers to convert the digital signals to corresponding analog signals suitable for coupling to typical video equipment.

Additionally, digital processing unit 104 produces a timing signal labeled "Timing Data" 126, which is provided to analog front-end 102 to control timing of the application of gain adjustments within analog front-end 102 and which is provided to components within digital processing unit 104 to synchronize timing of gain adjustments applied to components to correspond to events within the channelized signal being processed. In the case of ATV reception, such events can include vertical and horizontal blanking intervals and synchronization blackout periods.

Digital processing unit 104 complements the functionality of analog front-end 102 so that goals of amplitude regulation, SNR, linearity, selectivity, power consumption and cost are achieved. Digital processing unit 104 includes multiple amplifiers to provide fine-resolution gain-scaling to complement coarse discrete gain-scaling in analog front-end 102 in a cost-effective manner. Additionally, cost-effective, precise, repeatable, and electronically-reconfigurable channelization filtering, which is well-suited to digital implementation such as within data processing unit 104, complements the coarse channelization performed in analog front-end 102. Further, digital processing unit 104 operates to determine timing for modulation-specific AGC operations, conveying that timing to the analog front-end 102 via Timing Data 126.

Digital processing unit 104 is a CMOS digital implementation, which consumes power only upon switching of transistors, thereby reducing overall power consumption. In particular, the power consumption is directly related to the frequency of switching, the square of the power supply voltage, and the load seen by each individual transistor. These parameters can be manipulated to reduce power consumption for a required performance level. Another advantage is that high-volume CMOS production costs less as compared to more expensive processes including integration of bipolar junction transistors and CMOS technology into a single integrated circuit device (BiCMOS), Gallium-Arsenide (GaAs) process technologies, etc.

Digital signal processor 104 is connected to data processor 106 through a control bus 136, which carries a collection of digital control signals issued by data processor 106 to configure parameters of digital processing unit 102. Such parameters include controls to configure a demodulation method, to configure gains for amplitude scaling, and to configure filtering characteristics, such as bandpass filtering around fixed IF and image rejection. Digital processing unit 104 is also connected to data processor 106 through status bus 138, which carries a collection of digital status signals carrying, for example, IF signal level detection information and video level detection information from digital processing unit 104 to data processor 106. The digital status signals are used by algorithms implemented in the data processor 106 to provide gain control signals and other signals to analog-front-end 102 via control bus 132 and digital processing unit 104 via control bus 136.

Further, digital processing unit 104 is connected to data processor 106 to provide an interrupt signal labeled "Interrupt Signal" 140, which data processing unit 104 generates based upon modulation-specific information in the ADC Data 124, such as the presence of periodic synchronization intervals in a video signal. Interrupt Signal 140 provides the data processor 106 the ability to coarsely synchronize calculations and control outputs to real-time events within the signal.

Program memory 108 contains program lines or processor executable instructions specifying algorithms to be implemented by the data processor 106, allowing sophisticated, flexible, and reliable operation. Data processor 106 accesses program memory 108 through program bus 142. Data memory 112 stores data associated with the algorithms and is accessed by data processor 106 through data memory bus 144. Data memory 112 may also be used to store program lines or instructions for program development, maintenance, upgrade, or customization purposes.

User interface logic 114 provides an electrical interface to a host, such as a tuner circuit or other controller. User interface logic 114 provides a means by which the host can specify high-level parameters, such as which RF channel to extract from the RF input signal 122 and which modulation standard to apply to demodulate the extracted content. Further, user interface logic 114 provides a means for interfacing with receiver circuit 100 to specify details defining how amplitude regulation using the adjustable gain control functionality should be performed, including defining a turn-over point, configuring the data processor 106 to maintain the signal amplitude at one or more of the internal nodes at predetermined desirable levels, typically several below the peak level supported at the respective nodes, configuring final desired output amplitudes, etc. The host communicates with user interface logic 114 via a user interface bus 148, which can be any predetermined interface bus, including, for example, an inter-integrated circuit (I²C®) bus. The user interface logic 114 in turn communicates commands received from the host to data processor 106 for implementation via an internal command bus 146.

In operation, receiver 100 functions as a TV receiver adapted to receive and, (in the case of ATV reception), to demodulate TV channels from the RF input signal 122 In this instance, RF Input 122 is a broadband RF signal that includes energy from several TV signals modulated onto carrier waves at different frequencies. The different carrier wave frequencies constitute the TV channels from which TV content can be received. RF Input 122 can be received from an antenna, a satellite dish, a cable TV connection (such as a coaxial cable), or from another broadband signal source. Data processor 106 is adapted to control various elements of receiver circuit 100, including channelization, gain control, and other parameters.

In some instances of ATV reception, changes in the power level of the video output signal 130 greater than about 0.025 dB, which changes may be caused by gain stages within analog front-end 102 and/or digital processing unit 104, can produce visible artifacts in the brightness of a resulting image displayed on a display device, such as a monitor or TV, resulting in a noticeable flickering of an image. Analog gain steps of very high precision are difficult to design and implement. Accordingly, relatively few steps of course resolution in the analog domain followed by more steps of finer resolution in the digital domain is the chosen solution, making it possible to control the gain in such a way as to maintain desired performance in terms of linearity, amplitude, phase matching, signal-to-noise ratio, power consumption, etc. Further, digital processing unit 104 and data processor 106 cooperate to control both the timing and the size of the gain adjustments to reduce or eliminate visible artifacts within Video Signal 130.

Data processor 106 in conjunction with timing data 126 from digital processing unit 104 controls timing of application of the gain adjustments to each of the gain stages within analog front-end 102 and to control timing and size of gain adjustments to gains associated with amplifiers within digital processing unit 104. First, data processor 106 is configured to coordinate gain changes between the various gain stages of analog front-end 102. Further, data processor 106 is configured to coordinate gain changes of various amplifiers within data processing unit 104 to provide gain adjustments at a higher resolution than 0.025 dB and to control timing of the gain adjustments so that they correspond to non-visible portions of the signal, such as horizontal blanking intervals, vertical blanking intervals, or synchronization blanking periods within the signal. In some instances, receiver 100 can be controlled to produce gain adjustments at a resolution as fine as approximately 0.001 dB.

Further, data processor 106 may use coarse timing information based on interrupt signal 140 to control timing of gain adjustments of the various gain stages within analog front-end 102. Additionally, data processing unit 104 may provide timing Timing Data 126 to analog front-end 102 to synchronize timing of the gain adjustments to the non-visible portions of RF Input 122. When the RF Input 122 is an analog TV (ATV) signal, such non-visible portions occur at regular intervals, such as the horizontal and vertical blanking periods or synchronization blackouts within the TV signal. By controlling the timing of the higher resolution gain adjustments to correspond to non-visible portions of the TV signal, the visible artifacts are eliminated. The gain control operations will be described further with respect to FIGS. 2 and 3 below.

Figure 2:
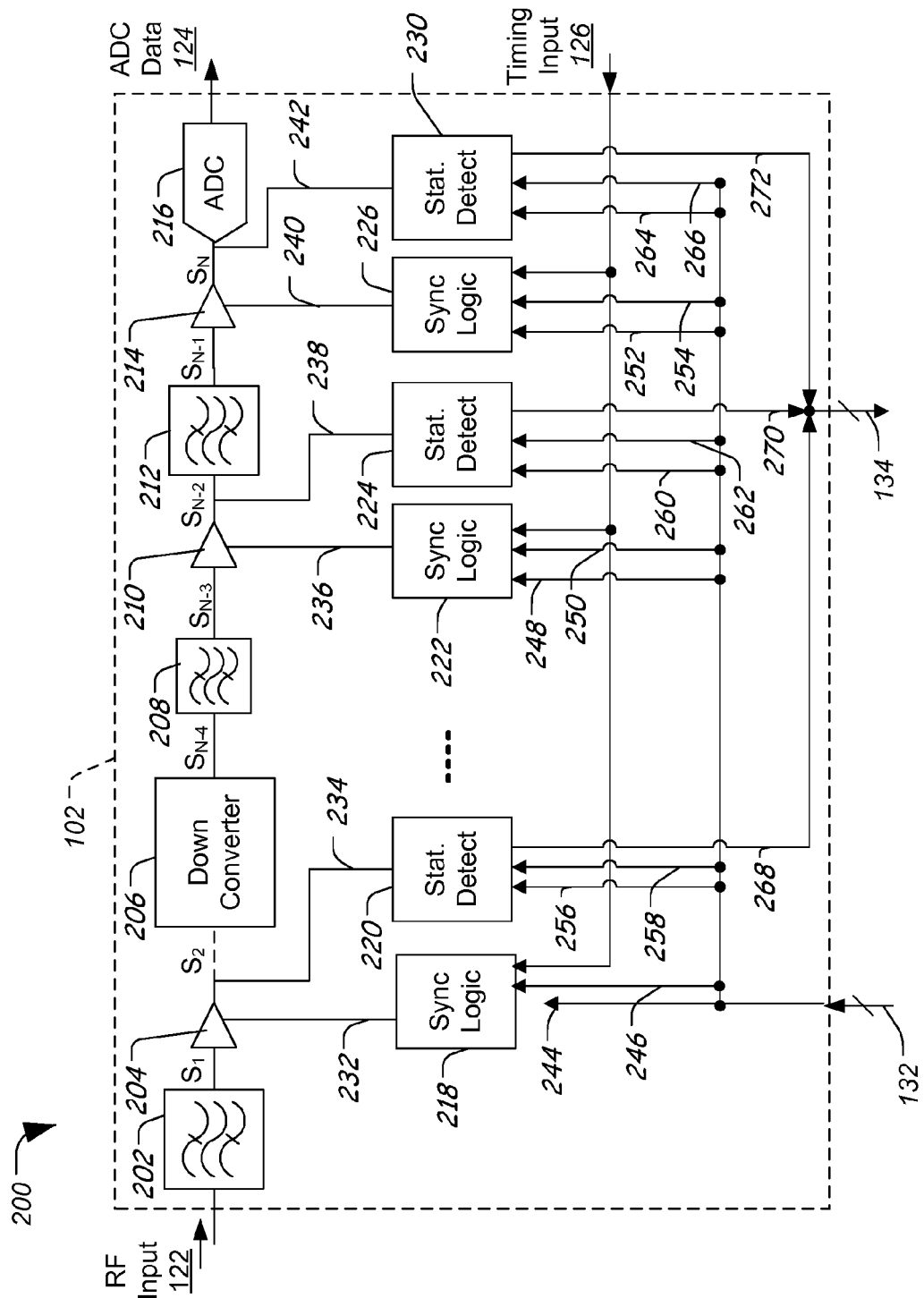
FIG. 2 is a block diagram of an embodiment of the analog front-end of the receiver circuit of FIG. 1.

FIG. 2 is a block diagram of an embodiment of analog front-end 102 of the receiver circuit 100 of FIG. 1. Analog front-end 102 includes a plurality of gain stages, where each gain stage includes a filter, an adjustable gain amplifier, synchronization logic, and a statistical detector. For example, a first gain stage includes a bandpass filter 202, amplifier 204, synchronization logic 218, and statistical detector 220. A second gain stage includes a filter 208, an adjustable gain amplifier 210, synchronization logic 222, and a statistical detector 224. Further, a third gain stage includes a filter 212, an amplifier 214, synchronization logic 226, and a statistical detector 230. Analog front-end 102 further includes a down-converter 206 and an analog-to-digital converter (ADC) 216. In other embodiments, more gain controlled and filter stages in the RF and IF sections could be present. Additionally, in other embodiments, the filter could be low-pass in nature.

Bandpass filter 202 includes an input for receiving RF Input 122 and an output connected to an input of adjustable gain amplifier 204 to provide a channelized signal ($S_1$). Adjustable gain amplifier 204 is connected to a gain control bus 232 for receiving a gain adjustment signal from synchronization logic 218 and includes an output connected to down-converter 206 to provide a signal ($S_2$), which is a scaled version of the channelized signal ($S_1$). The output of amplifier 204 is also connected via line 234 to statistical detector 220, which captures one or more parameters of the signal ($S_2$). In some embodiments, adjustable gain amplifier 204 may be connected to down-converter 206 through one or more additional gain stages (not shown), which may include a respective number of filters, adjustable gain amplifiers, synchronization logic, and statistical detectors. Moreover, filters can have a bandwidth that can be programmed dependent upon the frequency and nature of the channel received.

Down-converter 206 receives signal ($S_2$) and down-converts the signal ($S_2$) to an intermediate frequency (IF) signal ($S_{N-4}$), which is provided to filter 208. Filter 208 may be a low-pass or bandpass filter configured to remove interference or blockers from IF signal ($S_{N-4}$) to produce filtered signal ($S_{N-3}$), which is provided to an input of adjustable gain amplifier 210. Adjustable gain amplifier 210 is connected to synchronization logic 222 via a gain control bus 236 for receiving a gain adjustment signal. Adjustable gain amplifier 210 scales filtered signal ($S_{N-3}$) according to its configured gain setting to produce a signal ($S_{N-2}$), which is provided to an input of filter 212. Additionally, statistical detector 224 is connected to the output of amplifier 210 to sample parameters of the signal ($S_{N-2}$). As used herein, the term "statistical detector" refers to a signal strength detector which could extract extra statistical signal information, for example average, peak value, and RMS (root-mean-square) value. Filter 212 is configured to remove interference or blockers from the signal ($S_{N-2}$) to produce a signal ($S_{N-1}$), which is provided to an input of adjustable gain amplifier 214. Adjustable gain amplifier 214 is connected to synchronization logic 226 via a gain control bus 240 for receiving a gain adjustment signal. Adjustable gain amplifier 214 amplifies signal ($S_{N-1}$) to produce a signal ($S_N$), which is provided to an analog-to-digital converter (ADC) 216, which produces the ADC data signal 124. Additionally, statistical detector 230 is connected to the output of amplifier 214 to sample parameters associated with signal ($S_N$).

Synchronization logic circuit 218 is connected to control bus 132 through a mode control input 244 and a gain control input 246. Additionally, synchronization logic circuit 218 includes a timing input for receiving Timing Data 126 from data processing unit 104. Statistical detector 220 includes a clear input 256 and a control input 258 connected to control bus 132 and a status output 268 connected to status bus 134.

Synchronization logic circuit 222 is connected to control bus 132 through a mode control input 248 and a gain control input 250. Additionally, synchronization logic circuit 222 includes a timing input for receiving timing input signal 126 from digital processing unit 104. Statistical detector 224 includes a clear input 260 and a control input 262 connected to control bus 132 and a status output 270 connected to status bus 134.

Synchronization logic circuit 226 is connected to control bus 132 through a mode control input 252 and a gain control input 254. Additionally, synchronization logic circuit 226 includes a timing input for receiving Timing Data 126 from digital processing unit 104. Statistical detector 230 includes a clear input 264 and a control input 266 connected to control bus 132 and a status output 272 connected to status bus 134.

In operation, RF Input 122 is an RF signal provided to bandpass filter 202, which acts to attenuate undesired blockers and to channelize the RF signal to produce the signal $S_1$. Amplifier 204 is configured to scale the amplitude of the signal $S_1$, based on a desired input signal amplitude of a subsequent circuit (in this case down-converter 206) to produce the signal $S_2$. The gain of amplifier 204 is controlled by a gain control signal on gain control bus 232. The gain control signal is a digital signal (i.e. discrete in time and value), which is driven by synchronization logic 218. Synchronization logic 218 passes gain control information from the gain control signal on gain control input 246, optionally synchronized to Timing Data 126 according to the configuration control signal on synchronization enable input 244. Thus, synchronization logic 218 is configured to take coarsely synchronized control information from its gain control bus 246 and to pass a fully synchronized gain control value to amplifier 204 via gain control bus 232.

In an example, the adjustable amplifiers 204, 210, and 214 in analog front-end 102 may be configured to respond to digital gain control signals on gain control buses 232, 236, and 240, respectively, which digital gain control signals have logic "1" states and logic "0" states. In one instance, the amplifiers 204, 210, and 214 may be implemented in such a way as to implement gain changes abruptly, appearing to be substantially a step function. However, such step functions can produce noise in the desired signal, reduce the signal-to-noise ratio, and permit unwanted sideband intrusion (or splatter) into the signal. Accordingly, one or more of the amplifiers 204, 210, and 214 can include resistor-capacitor networks that cause the transitions between the logic states to occur more slowly, permitting the gain stages to be adjusted more gradually, producing less noise and improving the signal-to-noise ratio. Thus, the resistor-capacitor networks may be used to distribute the gain adjustment over time.

Filters 208 and 212 and amplifiers 210 and 214 operate in conjunction with synchronization logic 222 and 226 and statistical detector 224 and 230 in a fashion similar to filter 202, amplifier 204, synchronization logic 218, and statistical detector 220. In particular, the second and third gain stages cooperate to successively reject interferers and to rescale the signals ($S_{N-4}$, $S_{N-3}$, $S_{N-2}$, and $S_{N-1}$) to a desired amplitude for a next circuit input.

Synchronization logic circuits 222 and 226 operate similarly to synchronization logic 218, taking coarsely synchronized control information from their respective gain control buses 250 and 254, and passing fully synchronized gain control values to their respective amplifiers 210 and 214 via their respective gain control buses 236 and 240 based on the timing input signal 126. In particular, each of the synchronization logic circuits 222 and 226 is optionally synchronized to the timing input 126 as configured by their respective configuration control buses 248 and 252.

The signal ($S_N$) represents the final analog signal produced through n-filter/gain stages that is presented to the ADC 216. Signal ($S_N$) has been coarsely channelized by the succession of filters 202, 208, and 212 (as well as any additional filters in series) and adjusted in amplitude with respect to the input voltage range and dynamic range of the ADC 216 by amplifiers 204, 210, and 214 (as well as any additional amplifiers in series). Data processor 106 calculates the values of the various gains applied to the amplifiers 204, 210, and 214 using information reported from statistical detectors 220, 224, and 230 via status buses 268, 270, and 272, respectively, and using data reported by digital processing unit 106 via status bus 138. Data processor 106 issues commands to control each of the statistical detectors 220, 224, and 230 to configure their operating parameters via control inputs 258, 262, and 266 and to clear their respective statuses via clear/reset inputs 256, 260, and 264, respectively.

It should be understood that the embodiment of analog front-end 102 depicted in FIG. 2 is one of many possible embodiments. Other embodiments may have more filters and more amplifiers, providing any number of gain stages. Additionally, while control inputs and status outputs are depicted as being connected to a common control bus 132 and a common status bus 134, in other embodiments, any number of inputs and outputs may be provided. In an alternative embodiment, separate wire traces may be provided to interconnect the data processor 106 to analog front-end 102 and digital processing unit 104.

Figure 3:
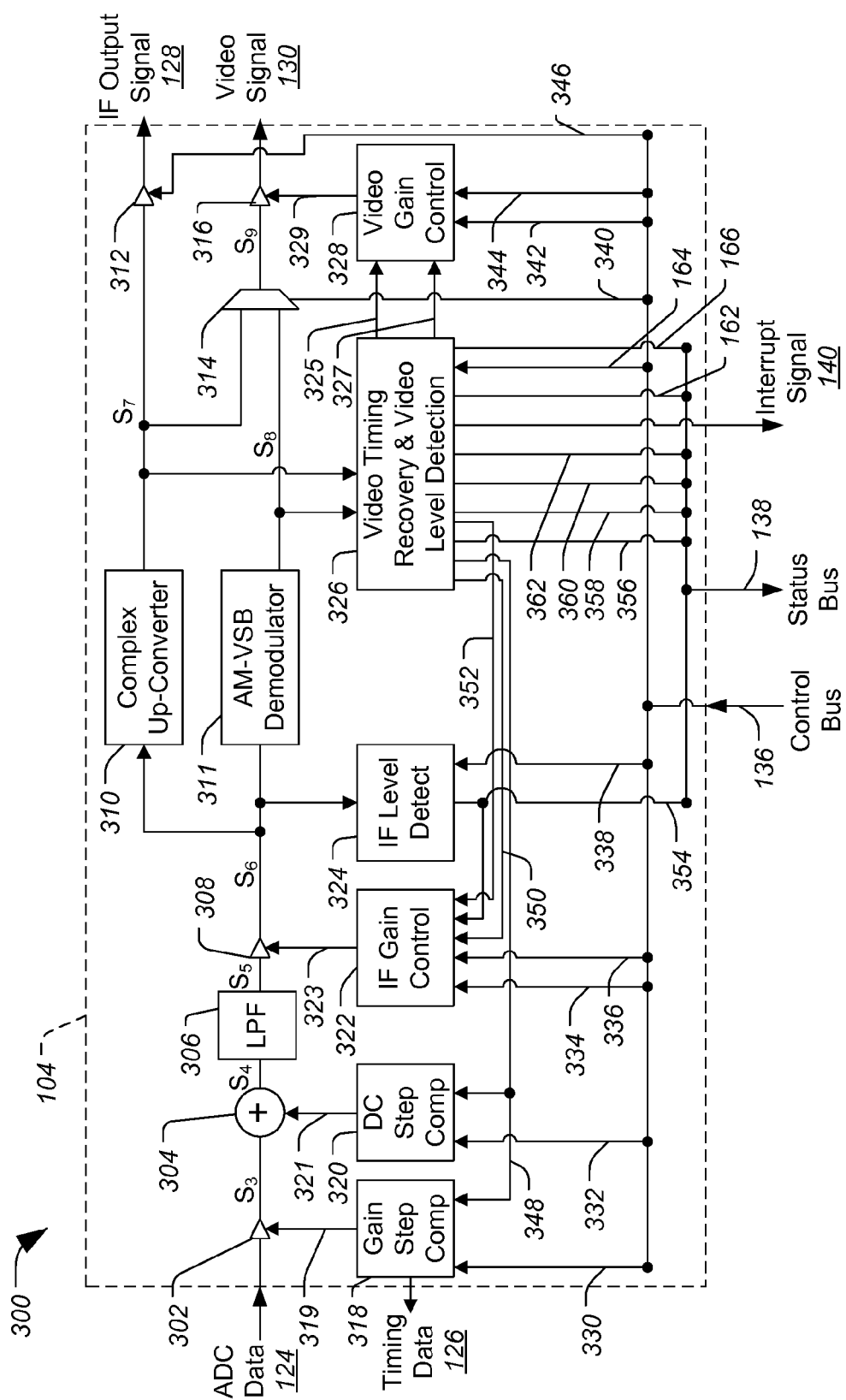
FIG. 3 is a block diagram of an embodiment of the data processing unit of the receiver circuit of FIG. 1.

FIG. 3 is a block diagram of an embodiment of the digital stage (digital processing unit 104) of the receiver circuit 100 of FIG. 1. Digital processing unit 104 depicted in FIG. 3 represents one of many possible implementations of the digital processing circuitry. Digital processing unit 104 includes amplifier 302 connected to analog front-end 102 for receiving ADC data signal 124, an adder 304, a low-pass filter (LPF) 306, an amplifier 308, a complex up-converter 310, an amplitude modulation (AM) vestigial side-band (VSB) demodulator unit 311, amplifiers 312 and 316, and a multiplexer 314 in the signal path. Additionally, digital processing unit 102 includes a gain step compensation unit 318, a DC step compensation unit 320, an intermediate frequency (IF) gain control unit 322, an IF level detection unit 324, a video timing recovery and video level detection unit 326, and a video gain control unit 328.

Amplifier 302 includes an input connected to analog front-end 102, a control input connected to gain step compensation unit 318 via amplifier control bus 319, and an output connected to an input of adder 304. Adder 304 includes a second input connected to DC step compensation unit 320 via compensation bus 321 and an output connected to LPF 306, which has an output connected to an input of amplifier 308. Amplifier 308 includes a control input connected to IF gain control unit 322 via amplifier control bus 323 and an output connected to inputs of complex up-converter 310, AM-VSB demodulator unit 311, and IF level detection unit 324. Complex up-converter 310 includes an output connected to inputs of amplifier 312, multiplexer 314, and video timing recovery and video level detection unit 326. Amplifier 312 includes a control input connected to amplifier control bus 346 and an output to provide IF Output Signal 128.

AM-VSB demodulator includes an output connected to inputs of multiplexer 314 and video timing recovery and video level detection unit 326. Multiplexer 314 includes a selection input connected to MUX select bus 340 and an output connected to an input of amplifier 316. Amplifier 316 includes a control input connected to video gain control unit 328 via amplifier control bus 329 and an output to provide Video Signal 130.

Gain step compensation unit 318, DC step compensation unit 320, IF gain control unit 322, IF level detection unit 324, video timing recovery and video level detection unit 326, video gain control unit 328, multiplexer 314, and amplifier 312 are connected to control bus 136. Gain step compensation unit 318, DC step compensation unit 320, IF gain control unit 322, IF level detection unit 324, and video timing recovery and video level detection unit 326 are also connected to status bus 138. Further, video timing recovery and video level detection unit 326 provides Interrupt Signal 140.

In operation, the ADC data input 124 from ADC 216 of analog front-end 102 is provided to amplifier 302. Gain step compensation unit 318 provides a gain step control signal to control a gain of amplifier 302 via amplifier control bus 319. Gain step compensation unit 318 is responsive to control information delivered by data processor 106 via control bus 136 and via control input 330 and is responsive to timing information developed by video timing recovery and video level detection unit 326 and delivered via timing control bus 348. Gain step compensation unit 318 operates to smooth out the amplitude step response of discrete gain steps produced by analog front-end 102 by controlling amplifier 302 to apply a series of smaller discrete digital gain steps to produce signal ($S_3$).

In a particular example, when the power level of RF Input 122 at analog front end 102 decreases by 0.5 dB, data processor 106 asserts appropriate gain control signals to both analog front end 102 and digital processing unit 104 to increase the overall gain of analog front end by 0.5 dB and to offset the increased gain by decreasing the gain of amplifier 302 by 0.5 dB. Data processor 106 then controls gain step compensation unit 318 to increase the gain of amplifier 302 by a total of 0.5 dB through a series of discrete steps over a period of time. In an example, the steps may be 0.002 dB increments. Similarly, when the power level of RF Input 122 suddenly increases by 0.5 dB, data processor 106 asserts appropriate gain control signals to both analog front end 102 and digital processing unit 104 to decrease the overall gain of analog front end by 0.5 dB and to offset the decreased gain by increasing the gain of amplifier 302 by 0.5 dB. Data processor 106 then controls gain step compensation unit 318 to decrease the gain of amplifier 302 by a total of 0.5 dB through a series of discrete steps over a period of time.

Additionally, gain step compensation unit 318 generates an output timing signal (timing data 126) to synchronize gain adjustments in analog front-end 102 based upon configuration information received from data processor 106 via control input 330 and based upon the timing information delivered via timing control bus 348.

DC step compensation unit 320 provides an adjustment signal to adder 304 to mitigate steps in the DC content of the signal path due to the gain stages in analog front-end 102 being applied to analog signals with unknown DC offsets. DC step compensation unit 320 is responsive to a control signal from data processor 106 received from control bus 136 through control input 332 and is synchronized to real-time events in the signal path by a timing signal received through timing control bus 348. The DC step compensation unit 320 is configured to smooth out steps in the DC content of the signal by applying an adjustment signal to provide a series of smaller discrete digital steps to adder 304. Adder 304 adds the signal ($S_3$) to the adjustment signal to produce a smoothed (or time interpolated) signal ($S_4$), which is provided to a low pass filter 306.

Gain step compensation unit 318 provides two mechanisms to support gain adjustments without producing noticeable video artifacts. First, when data processor 106 adjusts the gain of analog front-end 102 by 0.5 dB, gain step compensation unit 318 controls timing data signal 126 to control timing of the 0.5 dB adjustment within analog front-end 102 to correspond to non-visible portions of the RF input signal 122. Second, gain step compensation unit 318 adjusts the gain of amplifier 302 to achieve the desired gain through a period of smaller gain steps, such as 0.002 dB steps, thereby smoothing out the gain step over time. In a particular example, the number of discrete gain steps may be fixed. In another example, the number of discrete gain steps may be adjusted based on the size of the gain. For small gains, fewer steps may be used, while for larger gains, the number of discrete steps may be increased to smooth the gain steps. In one particular example, the discrete steps could have identical gain steps in decibels (dB), i.e. relatively increasing with the strength of the signal. Further, DC step compensation 320 is configured to mitigate the gain steps by applying the adjustment signal to node 304.

Low-pass filter 306 significantly attenuates blockers within signal ($S_4$) to produce a filtered signal ($S_5$), which is provided to the input of amplifier 308. Amplifier 308 scales the filtered signal ($S_5$) to produce an amplified signal ($S_6$), which has a desired amplitude.

IF gain control unit 322 controls the gain of amplifier 308 by applying a gain control signal to amplifier control bus 323. IF gain control unit 322 is configured to operate in one of several modes, which modes are controlled by a configuration signal received from data processor via control bus 136 and through configuration input 334. In a first mode, the IF gain control unit 322 acts simply to synchronize gain control information received via control bus 136 and gain control information input 336 to a timing signal developed by video timing and video level detection block 326 and provided via timing bus 350.

In a second mode, the IF gain control unit 322 filters level information present in level signals received either from IF level detect unit 324 via level detect status bus 354 or from video timing recovery and video level detection logic 326 via video level detect status bus 352, as determined by the configuration signal on configuration input 334. In this second mode, the IF gain control unit 322 periodically calculates the gain control signal as a function of the filtered level information that is synchronized to the timing signal, and applies the gain control signal to amplifier 308 via amplifier control bus 323.

In a third mode, the IF gain control unit 322 periodically calculates the gain control signal as in the second mode and then modulates the gain control signal applied to the amplifier control bus 323 to distribute the difference between successive calculations. By distributing the difference across successive calculations, the gain steps within signal ($S_6$) are smoothed out (interpolated in time) over the periodic interval of the timing signal received from video timing recovery and video level detection 326 via timing bus 350. In a particular example, the periodic interval may be approximately 64 microseconds.

IF level detection unit 324 calculates the amplitude of the signal ($S_6$). The amplitude is reported to data processor 106 via level status bus 354 and status bus 138. Data processor 106 may use the reported amplitude level in automatic gain control (AGC) algorithms to calculate gain controls for any amplifier stage in receiver 100. In an example, data processor 106 uses the IF level signal from level status bus 354 to determine a value for the IF gain control signal provided to IF gain control unit 322 via control bus 136 and gain control information input 336, and IF gain control unit 322 controls the gain in amplifier 308 via a gain control signal applied to amplifier control input 323. Alternatively, IF gain control unit 322 may use the IF level signal on level status bus 354 directly and substantially in real-time without intervention by data processor 106.

The AM-VSB demodulator unit 311 performs the well-known function of demodulation of an analog TV signal, resulting in a digital representation of a composite video, blanking and synchronization signal or digital CVBS ($S_8$). Such demodulation can be either coherent or non-coherent (i.e. envelope-detection) and results in the digital CVBS output signal ($S_8$). The amplitude of the digital CVBS output signal ($S_8$) is generally not well-regulated because of variability in the modulation depth applied at the transmitter as well as variability of levels of non-video signals that have not been rejected by channelization filters up to this point. For example, such non-video signals can include the sound signal that is typically transmitted along with the video signal or very close-in interfering signals. The AM-VSB demodulator unit 311 provides the final channelization filter to reject blockers prior to amplifier 316.

Complex up-converter unit 310 supports the IF Output Signal 128 of digital processing unit 104. Complex up-converter unit 310 frequency-translates the complex signal ($S_6$) to produce a digital IF signal ($S_7$) at some configurable IF frequency. Amplifier 312 scales the IF signal ($S_7$) under control of a gain control signal received from data processor 106 through control bus 136 and an amplifier control bus 346. Data processor 106 may use level information calculated by the video timing recovery and video level detection unit 326 and provided to data processor 106 through level status bus 368 and status bus 138 to produce the gain control signal. Thus, data processor 106 controls amplifier 312 to regulate the IF output signal 128 to a predetermined amplitude.

Multiplexer 314 includes a first input to receive digital IF signal ($S_7$), a second input to receive digital CVBS signal ($S_8$), and an output connected to amplifier 316. Multiplexer 314 is configured to select between digital IF signal ($S_7$) and digital CVBS signal ($S_8$) to drive amplifier 316, as determined by a multiplexer control signal configured by data processor 106 and provided to multiplexer 314 through multiplexer control bus 340.

Video gain control unit 328 controls the gain of amplifier 316 based on configuration signals and gain control signals received from data processor 106 through configuration input 342 and gain control input 344, respectively. Additionally, Video gain control unit 328 receives timing information and video level information from video timing recovery and video level detection unit 326 through timing bus 325 and level bus 327, respectively. Video gain control unit 328 is configured to control the gain of amplifier 316 by applying a gain control signal to amplifier control bus 329. Video gain control unit 328 provides regulation of the amplitude of the CVBS baseband signal ($S_8$) once all blockers are removed.

The distinction between amplifiers 312 and 316 is that amplifier 316 offers synchronization to the timing information on timing bus 325 developed by video timing recovery and video level detection unit 326, which is further processed and interpolated by video gain control unit 328. In contrast, amplifier 312 affords only the coarse synchronization typical of microprocessor interactions, namely synchronization tied to interrupt signal 140. In certain IF output applications, such as digital TV, the coarse synchronization of amplifier 312 is acceptable, whereas in others, such as analog TV, the finer synchronization of amplifier 316 may be desirable.

Analogous to the IF gain control unit 322, the video gain control unit 328 operates in one of several modes, as defined by the configuration signal received from configuration input 342. In a first mode, the video gain control unit 328 acts simply to synchronize the gain control information on gain control input 344 from data processor 106 to the timing signal developed by the video timing and video level detection unit 326 on timing bus 325. In a second mode, the video gain control unit 328 filters the level information present in the level signals on level bus 327 and periodically calculates the gain control signal as a function of the filtered level information synchronized to the timing signal on timing bus 325. In a third mode, the video gain control unit 328 periodically calculates the gain control signal as a function of the filtered level information as in the second mode and further distributes the difference between successive calculations. In this third mode, the gain adjustment of the gain control signal may be interpolated in time (smoothed out) over the periodic interval of the timing signal on timing bus 325, which periodic interval may be approximately 64 microseconds.

Video timing recovery and video level detection unit 326 synchronizes to periodic content in the baseband analog TV video signal ($S_8$) and produces timing pulses on timing buses 348, 350, and 326, which timing pulses occur at predetermined instances (times) within the synchronization period. Video timing recovery and video level detection unit 326 also produces a periodic interrupt signal on interrupt bus 140 at a predetermined point in the synchronization period, which periodic interrupt signal can be used by data processor 106 for coarse synchronization to real-time events. Video timing recovery and video level detection unit 326 captures significant statistics of the baseband video signal ($S_8$), including the amplitude of the sync pulse which is provided on synch output 356, the amplitude of the back-porch which is provided on back-porch output 358, the minimum signal level detected during the period which is provided on minimum signal level output 360, the peak signal detected during the period which is provided on peak level output 362, and a level signal on level bus 327, which is used by video gain control unit 328 to determine the gain control signal on amplifier control input 329 to regulate the amplitude of video output 130.

The back-porch signal portion refers to the portion in each scan line of a video signal between the end (rising edge) of the horizontal sync pulse and the start of active video. Typically, the back-porch signal is used to restore the black level (300 mV.) reference in analog video. In signal processing terms, the back-porch compensates for the fall time and settling time following the sync pulse.

Video timing recovery and video level detection unit 326 reports synchronization status to the data processor 106 via a lock status signal applied to lock status output 364. Data processor 106 may then gate AGC operations or reconfigure various controls according to the synchronization status of the receiver 100, such as by switching from a coarsely controlled gain adjustment that provides a rapidly responsive configuration during an initial signal acquisition period to a more finely controlled gain adjustment configuration after synchronization is achieved. Further, data processor 106 may provide control information to video timing recovery and video level detection unit 326 through control bus 136 and control input 366.

Digital processing unit 104 compensates for limitations imposed upon the analog front-end 102 for achieving low-power and good noise performance goals. In particular, digital processing unit 104 applies discrete gain steps to compensate the ADC data 124 from analog front-end 102 to produce the signal ($S_3$). Gain step compensation unit 318 is configured to distribute larger analog gain steps into finer steps over the periodic interval of the timing signal on timing bus 348. DC step compensation unit 320 deals with resulting DC steps by applying smaller discrete digital steps to smooth out the signal ($S_3$) to produce the signal ($S_4$). Further, IF level detect unit 324 and IF gain control unit 322 cooperate to substantially smooth out the gain steps and regulate the input signal ($S_6$) to the AM-VSB demodulator 311 and complex up-converter 310, removing most, if not all, of the signal amplitude variation.

Video timing recovery and video level detection unit 326 produces timing information that can be used by IF gain control 322, gain step compensation unit 318, DC step compensation unit 320, video gain control unit 328, and/or data processor 106 to make gain adjustments and to produce timing data signal 126 to control timing of analog step changes during portions of the waveform that are not in the visible image of the analog TV signal, such as within horizontal and/or vertical blanking intervals within the analog TV signal. If such step changes were applied during the visible image of the analog TV signal, such changes may produce visible artifacts, such as noticeable brightness variations or flickering within an image. By applying the gains within the non-visible portions of the TV signal, artifacts within the displayed image are avoided.

Data processor 106 is configured to execute algorithms and/or processor-readable instructions stored in program memory 108. Data processor 106 allows highly sophisticated and flexible use of all of the level and timing information from both analog front-end 102 and digital processing unit 104 to drive all of the gains stages to regulate the amplitude of both the IF output 128 and the video output 130.

In conjunction with the receiver circuit 100, analog front-end 102, and digital processing unit 104 described above with respect to FIGS. 1-3, a receiver architecture is disclosed that is configurable to provide automatic gain control functionality with respect to a received RF input signal to produce a desired output signal without gain-step induced visible artifacts. In particular, the analog front-end is configured to cooperate with the digital processing unit and a data processor to control the step size and timing of the gain adjustments to incrementally adjust the gain over a synchronization period and, in the case of ATV signal reception, to apply the gains within blanking intervals of the video signal so that the gain steps do not produce visible artifacts within the video output signal.

Although the present invention has been described with reference to preferred embodiments, workers skilled in the art will recognize that changes may be made in form and detail without departing from the scope of the invention.

What is claimed is:

1. A receiver circuit comprising:
an analog front-end including an input for receiving a radio frequency (RF) signal, a first control input for receiving a gain adjustment signal, a second control input for receiving a timing signal, and a signal output for providing a digital intermediate frequency (IF) signal, the analog front-end updating gains of a plurality of gain stages according to the gain adjustment signal and in synchronism with the timing signal, wherein each of the plurality of adjustable gain stages comprises:
a filter including a filter input and a filter output; and
an adjustable gain amplifier including an amplifier input coupled to the filter output, an amplifier control input, and an amplifier output;
a control bus coupled to the digital processing unit; and
synchronization logic including a first synchronization input coupled to the control bus to receive the gain adjustment signal, a second input coupled to the digital processing unit to receive the timing signal, and a control output coupled to the amplifier to apply the gain adjustment signal in response to the timing signal; and
a digital processing unit coupled to the analog front-end and configured to produce at least one output signal derived from the digital IF signal, the digital processing unit including a timing recovery circuit configured to generate the timing signal based on the digital IF signal to control timing of the updating of gains of each of the plurality of adjustable gain stages.

2. The receiver circuit of claim 1, wherein the analog front-end and the digital processing unit are fabricated using complementary metal oxide semiconductor (CMOS) technology.

3. The receiver circuit of claim 1, wherein the timing signal identifies one or more timing intervals associated with non-visible portions of a video image within the RF signal.

4. The receiver circuit of claim 3, wherein the one or more timing intervals comprise a horizontal blanking interval and a vertical blanking interval.

5. The receiver circuit of claim 1, wherein the timing signal adjusts a gain associated with each of the plurality of adjustable gain stages to adjust each of the plurality of adjustable gain stages at different times.

6. The receiver circuit of claim 1, further comprising:
a data processor coupled to the plurality of gain stages and configured to produce the gain adjustment signal; and
wherein each of the plurality of adjustable gain stages further comprises:
statistical collector logic coupled to the amplifier output of each of the plurality of adjustable gain stages and configured to detect one or more parameters associated with a signal on the amplifier output, the statistical collector logic providing a status signal to the data processor that is related to the one or more parameters;
wherein the data processor controls the gain adjustment signal for each of the plurality of adjustable gain stages in response to the status signal.

7. A receiver circuit comprising:
an analog front-end including an input for receiving a radio frequency (RF) signal, a first control input for receiving a gain adjustment signal, a second control input for receiving a timing signal, and a signal output for providing a digital intermediate frequency (IF) signal, the analog front-end updating gains of a plurality of gain stages according to the gain adjustment signal and in synchronism with the timing signal; and
a digital processing unit coupled to the analog front-end and configured to produce at least one output signal derived from the digital IF signal, the digital processing unit including a timing recovery circuit configured to generate the timing signal based on the digital IF signal to control timing of the updating of gains of each of the plurality of adjustable gain stages, wherein the digital processing unit further comprises:
a video amplifier including an input to receive a video signal and an output to provide a video output signal; and
a video gain control circuit including a control input for receiving a gain control signal from the data processor, a timing input coupled to the timing recovery circuit to receive a timing control signal, and an output coupled to the video amplifier, the video gain control circuit responsive to the timing control signal to selectively adjust a video gain of the video amplifier.

8. The receiver circuit of claim 7, wherein the timing signal adjusts a gain associated with each of the plurality of adjustable gain stages to adjust each of the plurality of adjustable gain stages at different times.

9. The receiver circuit of claim 7, wherein each of the plurality of adjustable gain stages comprises:
a filter including a filter input and a filter output; and
an adjustable gain amplifier including an amplifier input coupled to the filter output, an amplifier control input, and an amplifier output;
a control bus coupled to the digital processing unit; and
synchronization logic including a first synchronization input coupled to the control bus to receive the gain adjustment signal, a second input coupled to the digital processing unit to receive the timing signal, and a control output coupled to the amplifier to apply the gain adjustment signal in response to the timing signal.

10. The receiver of claim 7, further comprising:
a data processor coupled to the plurality of gain stages and configured to produce the gain adjustment signal; and
wherein each of the plurality of adjustable gain stages further comprises:
statistical collector logic coupled to the amplifier output of each of the plurality of adjustable gain stages and configured to detect one or more parameters associated with a signal on the amplifier output, the statistical collector logic providing a status signal to the data processor that is related to the one or more parameters;
wherein the data processor controls the gain adjustment signal for each of the plurality of adjustable gain stages in response to the status signal.

11. A receiver circuit comprising:
an analog front-end configured to process a radio frequency (RF) input signal in a plurality of gain stages and convert the RF input signal to a digital intermediate frequency (IF) signal by adjusting gains of the plurality of gain stages according to a gain adjustment signal in synchronism with a gain adjustment timing signal, wherein each of the plurality of gain stages comprises:
a filter including a filter input and a filter output; and
an adjustable gain amplifier including an amplifier input coupled to the filter output, an amplifier control input, and an amplifier output;
a control bus coupled to the digital processing unit; and
synchronization logic including a first synchronization input coupled to the control bus to receive the gain adjustment signal, a second input coupled to the digital processing unit to receive the timing signal, and a control output coupled to the amplifier to apply the gain adjustment signal in response to the timing signal; and
a digital processing unit configured to receive the digital IF signal, produce a digital output derived from the digital IF signal and produce the gain adjustment timing signal.

12. The receiver circuit of claim 11, wherein the RF input signal comprises a television signal, and wherein the gain adjustment timing signal corresponds to a horizontal blanking interval and a vertical blanking interval of the television signal.

13. The receiver circuit of claim 11, further comprising:
a data processor coupled to the analog front-end and configurable to determine a gain of each of the plurality of gain stages and to provide the gain adjustment signal to the analog front-end to adjust the gains of each of the plurality of gain stages.

14. The receiver circuit of claim 13, wherein the digital processing unit comprises:
a timing recovery circuit configured to generate the timing recovery signal based on the digital IF signal; and
a video amplifier including an input to receive a video signal, a timing input to receive a second timing signal from the timing recovery circuit, and an output coupled to a video output terminal to provide a video output.

15. The receiver circuit of claim 14, wherein the video amplifier is responsive to a video gain adjustment signal from the data processor to adjust a gain of the video amplifier according to the second timing signal from the timing recovery circuit.

16. A method of adjusting a gain of a receiver circuit, the method comprising:
receiving an input signal at an analog front-end including multiple adjustable gain stages;
processing the input signal to produce a digital signal using the analog front-end;
processing the digital signal using a digital processing unit to produce at least one signal output and a timing signal; and
providing the timing signal from the digital processing unit to the analog front-end to control timing of an adjustment of gain parameters of the multiple adjustable gain stages;
providing a second timing signal to an intermediate frequency gain control circuit of the digital processing unit to control a gain parameter of an amplifier circuit of the digital processing unit;
providing a control signal to the intermediate frequency gain control circuit to adjust a gain of the amplifier circuit, wherein providing the control signal comprises,
in a first mode, synchronizing a gain adjustment signal from a microprocessor to the second timing signal to update the gain parameter of the amplifier circuit;
in a second mode, filtering level information present in level signals at an output of the amplifier circuit; and
in a third mode, distributing a gain adjustment signal between successive calculations to interpolate an adjustment of the gain parameter in time over a period interval of the second timing signal.

17. The method of claim 16, wherein processing the digital signal using the digital processing unit comprises:
identifying horizontal blanking intervals and vertical blanking intervals within the digital signal; and
generating the timing signal to control timing of the adjustment of the gain parameters to correspond to at least one of the horizontal blanking intervals and the vertical blanking intervals.

18. The method of claim 16, wherein selectively adjusting the gain parameters comprises:
updating a first adjustable gain stage of the multiple adjustable gain stages with a first gain parameter during each vertical blanking interval;
updating a second adjustable gain stage of the multiple adjustable gain stages with a second gain parameter during one of the horizontal blanking intervals at discrete intervals defined by a number of the horizontal blanking intervals; and
updating a third adjustable gain stage of the multiple adjustable gain stages with a third gain parameter during every horizontal blanking interval.

* * * * *